United States Patent [19]

Sarraf

[11] Patent Number: 5,307,359
[45] Date of Patent: Apr. 26, 1994

[54] MONOLITHIC SEMI-CONDUCTOR LASER PRODUCING BLUE, GREEN AND RED OUTPUT WAVELENGTHS

[75] Inventor: Sanwal P. Sarraf, Webster, N.Y.

[73] Assignee: Eastman Kodak Company, Rochester, N.Y.

[21] Appl. No.: 992,305

[22] Filed: Dec. 21, 1992

[51] Int. Cl.$^5$ .............................................. H01S 3/10
[52] U.S. Cl. .................................. 372/21; 372/22; 372/28; 372/50
[58] Field of Search ................. 372/21, 22, 26, 28, 372/32, 43, 50; 385/131, 132, 122; 359/328

[56] References Cited

U.S. PATENT DOCUMENTS

| | | | |
|---|---|---|---|
| 4,803,692 | 2/1989 | Sakano et al. | 372/50 |
| 4,824,220 | 4/1989 | Yamamoto et al. | 372/22 |
| 4,993,036 | 2/1991 | Ikeda et al. | 372/50 |
| 5,003,550 | 3/1991 | Welch et al. | 372/50 |
| 5,008,890 | 4/1991 | McFarlane | 372/41 |
| 5,166,703 | 11/1992 | Watanabe et al. | 346/108 |

Primary Examiner—Frank Gonzalez
Attorney, Agent, or Firm—Robert L. Randall

[57] ABSTRACT

A monolithic multi-color laser comprising a semiconductor laser formed on a substrate for lightwave generation. Means is provided for exciting the laser and means is provided on the substrate adjacent the laser to double the frequency of the lightwave emitted from the laser to produce output lightwaves having wavelengths in the photo-sensitive region of conventional silver halide photographic material. Further, an individually controllable frequency matched lightwave modulator is mounted on the substrate and is arranged to individually control the output lightwave in response to a data signal.

9 Claims, 1 Drawing Sheet

MONOLITHIC SEMI-CONDUCTOR LASER PRODUCING BLUE, GREEN AND RED OUTPUT WAVELENGTHS

BACKGROUND OF THE INVENTION

1. Field of the Invention

The present invention is directed to a monolithic semi-conductor laser which emits a single light beam having blue, green and red wavelengths and which is suitable for use in transmission, processing, generating, or printing multi-wavelength-light information.

2. Description of the Prior Art

Semi-conductor lasers are known which are used in a variety of analog and digital color imaging systems. However, the colors available from the semi-conductor lasers of the prior art do not match the frequency of conventional color photographic film and paper. As a result it has been necessary to employ special films and paper which are false sensitized to the wavelengths which are available from the semi-conductor lasers or to substitute larger, bulkier, and more expensive gas lasers which can produce the desired light frequencies. However, as previously noted, such gas lasers are both expensive and bulky, reducing their usefulness in some printing operations. Moreover, none of the semiconductor or the gas lasers can provide more than a limited range of wavelengths so that a plurality of such lasers must be employed to produce a full color image. When a plurality of such light sources are utilized, it is necessary to employ complex, space-consuming, and expensive light combining systems in order to combine the various light beams into a single writing beam. Otherwise it is necessary to sequentially employ the various wavelength lasers in a plurality of passes which is both costly and time-consuming.

U.S. Pat. No. 4,993,036 discloses a semiconductor laser array which includes a plurality of lasers capable of producing coherent light having different wavelengths. However, it will be seen that the examples of the different wavelengths capable from the arrangement disclosed therein vary only between 808 nm and 869 nm, neither of which correspond to a wavelength to which conventional photographic films and papers are sensitive. Moreover, this patent discloses a laser array comprising a plurality of lasers which are spaced along the array and thus must employ additional optics to combine the various light outputs into a single beam.

SUMMARY OF THE INVENTION

Accordingly, it will be appreciated that the provision of a single laser capable of producing a single coherent multi-color output light beam at wavelengths to which conventional photographic films and papers are sensitive, would be extremely advantageous and desirable.

According to one aspect of the present invention a monolithic multi-color laser is provided comprising a semiconductor laser formed on a substrate for lightwave generation. Means is provided for exciting the laser and means is provided on the substrate adjacent the laser to double the frequency of the lightwave emitted from the laser to produce output lightwaves having wavelengths in the photo-sensitive region of conventional photographic film. Further, an individually controllable frequency matched lightwave modulator is mounted on the substrate and is arranged to individually control the output lightwave in response to a data signal.

According to another aspect of the present invention a monolithic three-color laser is provided which comprises a channel waveguide comprising one of Nd-doped LiNbO$_3$ or Nd-doped glass formed on a substrate for lightwave generation. A diode laser is mounted on the substrate which produces a coherent lightwave having a wavelength substantially equal to 870 nm, which lightwave is directed into and excites the channel waveguide to generate additional lightwaves having wavelengths substantially equal to 1060 nm and 1300 nm. Frequency doubling periodically poled domain inverted gratings are mounted on the substrate and are disposed adjacent the waveguide opposite the diode laser. The gratings are arranged to double the frequency of the three lightwaves emitted from the waveguide to produce lightwaves having wavelengths substantially equal to 435 nm, 530 nm and 650 nm, respectively, which substantially match the blue, green and red sensitivities, respectively, of a silver halide photographic material. A plurality of individually controllable frequency matched lightwave modulators are mounted on the substrate and are arranged to individually control each of the output lightwaves in response to data signals. At least one output filter is mounted at the output of the modulators to remove lightwaves having wavelengths other than the output lightwaves, whereby a modulated three color output light beam is produced.

According to a still further aspect of the present invention, a method of generating a three-color light beam is provided comprising the steps of producing a lightwave having a wavelength substantially equal to 870 nm and introducing it into and exciting a waveguide to generate additional lightwaves having wavelengths substantially equal to 1060 nm and 1300 nm. The three lightwaves are frequency doubled to produce output lightwaves having wavelengths substantially equal to 435 nm, 530 nm and 650 nm, respectively. The respective output lightwaves are individually controlled in response to data signals by being passed through a plurality of individually controllable frequency matched lightwave modulators, and lightwaves having wavelengths other than the output lightwaves are removed whereby a modulated three-color coherent output light beam is produced.

Various means for practicing the invention and other features and advantages thereof will be apparent from the following detailed description of an illustrative preferred embodiment of the invention, reference being made to the accompanying drawing.

Figure 1:
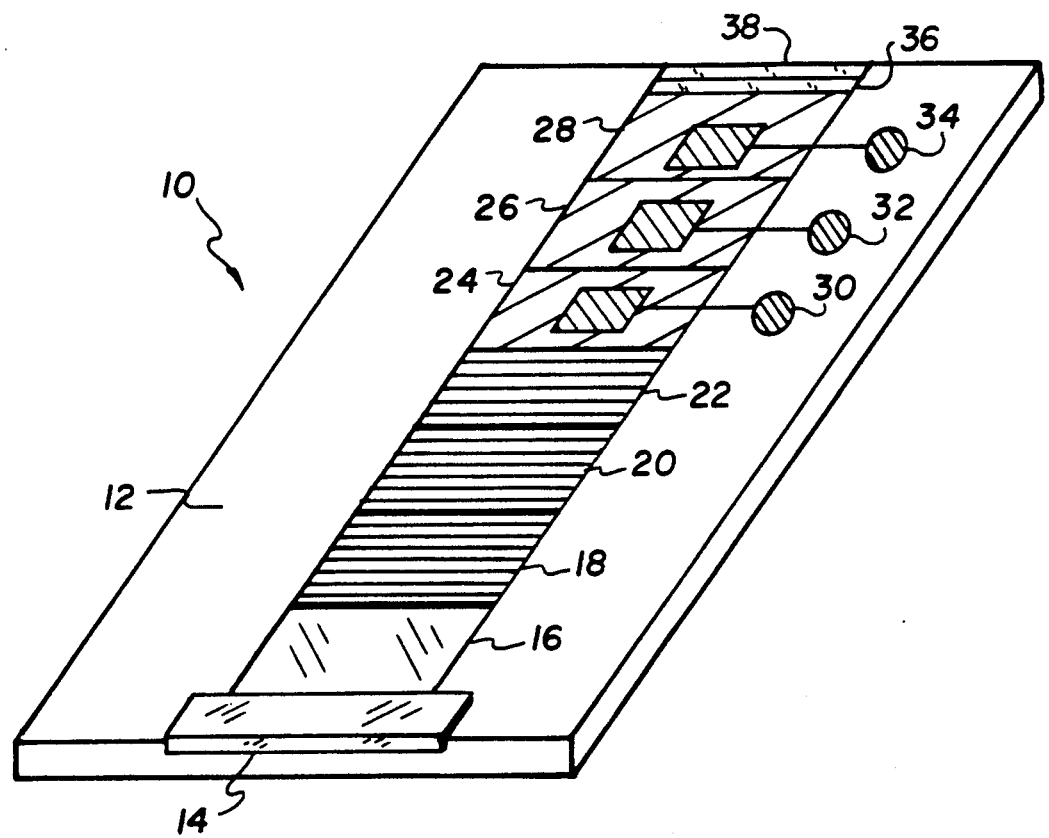
FIG. 1 is a perspective view of a multi-color monolithic solid state laser.

DESCRIPTION OF THE PREFERRED EMBODIMENT:

A monolithic solid-state laser assembly 10 producing a modulated coherent beam containing three distinct wavelengths is illustrated in FIG. 1 and comprises a substrate 12 on one end of which is formed a diode laser 14 which produces a lightwave having a wavelength of 870 nm. A channel waveguide 16, comprising either a Nd-doped LiNbO$_3$ or an Nd-doped glass, is formed on the substrate 12 and is optically coupled to the output of the diode laser 14 so that the channel waveguide is pumped by the diode laser output. The channel waveguide is pumped by the 870 nm lightwave whereby guided luminescence, due to the $^4F_{3/2} \rightarrow ^4I_{11/2}$ and $^4F_{3/2} \rightarrow ^4I_{13/2}$ transitions therein, generates lightwaves having wavelengths substantially equal to 1060 nm and 1300 nm, respectively, While a portion of the input lightwave passes unaffected through the channel waveguide.

A plurality of frequency doubling, periodically poled, domain inverted gratings 18, 20 and 22 are formed on the substrate 12 adjacent the channel waveguide on the opposite side from the diode laser 14. Each of these gratings is arranged to double the frequency of one of the lightwaves emitted from the diode laser and the waveguide to produce output lightwaves having wavelengths substantially equal to 435 nm, 530 nm and 650 nm, respectively. Because of phase matching conditions, the gratings selectively operate on a particular wavelength radiation and leave others unaffected. The grating period for exact matching is given by:

$$\Lambda_0 = (\lambda/2)/(N^{2\omega} - N^\omega) \quad (1)$$

where $N^{2\omega}$ and $N^\omega$ are mode indices of the second harmonic and pump wavelengths, respectively, and $\lambda$ denotes the pump wavelength. The phase mismatch $2\Delta$ for grating period $\Lambda$ is given by:

$$2\Delta = (2\pi/\Lambda_0^2)(\Lambda - \Lambda_0) \quad (2)$$

The quasi-phase matching second harmonic generation efficiency $\eta$ is given by $$\eta = \eta_0 (sing\ (\Delta \cdot L)/(\Delta \cdot L))^2 \quad (3)$$

where $\eta_0$ denotes the efficiency at exact matching, and L the grating length. Equation (3) shows that for $|\Delta L| < 1$ the efficiency $\eta$ is higher than 0.71 $\eta_0$, i.e., the efficiency reduction due to mismatch is very small.

A plurality of individually controllable frequency matched lightwave modulators 24, 26 and 28 are mounted on the substrate 12 and are optically coupled to the gratings opposite the channel waveguide. The lightwave modulators vary the intensity of the radiation of each light beam by varying the coupling between an evanescent portion of the radiation and a guided wave. In this modulator, coupling of energy between the waveguide and the electro-optic media occurs only when the wave vector in the direction of propagation of the guided wave is nearly equal to the wave's propagation constant $\beta$. This matching of propagation constants enable selective modulation of radiation at a specific wavelength. Thus, each of the modulators is selected to match and control one of the frequencies of the output lightwaves from the gratings 18, 20, or 22. Each of the modulators 24, 26 and 28, is provided with an electrode 30, 32 and 34, respectively, which is connected to a source of data which actuates the modulators to provide a modulated output beam of radiation.

One or more output filters 36 and 38 are provided at the output end of the waveguide, at the output of modulators 24, 26 and 28, which provide a wavelength cutoff at a frequency given by:

$$\lambda_0 \leq (32 \cdot n_o \cdot \Delta n)^{\frac{1}{2}} t \quad (4)$$

where t is the waveguide thickness, $\Delta n$ is the difference in refractive index with the substrate, and $n_o$ is the waveguide refractive index. These filters either operate alone or in combination with the modulators to remove any residual fundamental radiation at wavelengths of 870 nm, 1060 nm, and 1300 nm so that the spectrum of the output beam may be accurately controlled.

ALTERATIVE EMBODIMENTS

While the preferred embodiment has been illustrated with components formed on a common substrate, it will be appreciated that other constructions are possible as long as the various components are optically coupled to permit transfer of the lightwave radiation therebetween.

Moreover, while a specific example providing an output lightwave having radiation in the red, blue and green spectrum has been disclosed, other wavelength combinations may be used as well. Particularly, it is possible to substitute infra-red wavelengths for those disclosed herein by use of other rare earth dopant materials such as $E_r$, etc. Still further while the preferred embodiment discloses the generation of three separate wavelength beams as a common output beam, the present invention is equally applicable to devices generating two or more wavelengths according to the teachings hereof.

Still further, it will be appreciated that in addition to modulated output lightwaves, the present invention can be equally advantageous in providing a continuous wave output without the use of the modulators.

It will accordingly be seen that the present invention provides an inexpensive, compact monolithic laser source providing a plurality of wavelengths. Specifically, a red, green and blue output beam may be provided which substantially correspond to the wavelength sensitivities of silver halide photographic materials. Further, by providing a lightbeam which is coherent and provides guided mode radiation, it is possible to provide a beam which is highly collimated and easily focused. Still further, the provision of a coherent light beam and the co-propagation of the different light wavelengths as a single beam enables the use of inexpensive optics for radiation management.

The invention has been described in detail with particular reference to a presently preferred embodiment, but it will be understood that variations and modifications can be effected within the spirit and scope of the invention.

I claim:

1. A monolithic multi-color laser comprising:
   a substrate,
   a semi-conductor laser capable of lightwave generation, mounted on said substrate,
   means for exciting said laser,
   means mounted on said substrate for generating a second harmonic of at least a portion of said lightwave generated by said laser and optically coupled to the output of said laser to produce output lightwaves having first and second wavelengths, and
   an individually controllable frequency matched lightwave modulator mounted on the substrate and optically coupled to he output of the second harmonic generating means to individually control at least one of said output lightwaves in response to a data signal.

2. A monolithic multi-color laser according to claim 1 wherein said means for generating a second harmonic of at least a portion of said lightwave generated by said laser comprises a channel waveguide optically coupled to the output of said laser to produce said output lightwaves having first and second wavelengths.

3. A monolithic multi-color laser according to claim 2 wherein said means for generating a second harmonic of at least a portion of said lightwave generated by aid laser comprises a channel waveguide comprising one of Nd-doped LiNbO$_3$ or a Nd-doped glass which generates lightwaves having at least two additional wavelengths.

4. A monolithic multi-color laser according to claim 3 wherein said semi-conductor laser generates a lightwave having a wavelength of substantially 870 nm and said additional lightwaves have wavelengths of substantially 1060 nm and 1300 nm, respectively.

5. A monolithic three-color laser comprising:
channel waveguide comprising one of Nd-doped LiNbO$_3$ or a Nd-doped glass formed on a substrate for lightwave generation,
a diode laser producing a coherent lightwave having a wavelength substantially equal to 870 nm mounted on said substrate and directing said lightwave into and exciting said channel waveguide to generate additional lightwaves having wavelengths substantially equal to 1060 nm and 1300 nm,
frequency doubling periodically poled domain inverted gratings mounted on said substrate and disposed adjacent the waveguide opposite said diode laser, said gratings arranged to double the frequency of the three lightwaves emitted from said waveguide to produce output lightwaves having wavelengths substantially equal to 435 nm, 530 nm and 650 nm, respectively, which substantially match the blue, green and red sensitivities, respectively, of a silver halide photographic material,
a plurality of individually controllable frequency matched lightwave modulators mounted on said substrate and optically coupled to the output of the gratings to individually control each of said output lightwaves leaving said gratings in response to data signals, and
at least one output filter mounted on said substrate and optically coupled to the output of the lightwave modulators to remove lightwaves having wavelengths other than said output lightwaves, whereby a modulated three color output light beam is produced.

6. A method of generating a multi-color light beam comprising the steps of producing a coherent lightwave having a first wavelength and introducing it into a waveguide to generate at least one additional lightwave having a second wavelength, frequency doubling said first and second lightwaves to produce output lightwaves having wavelengths substantially one-half of that of the first and second lightwaves, respectively, whereby a co-propagated coherent multi-color output light beam is produced.

7. The method of generating a multi-color light beam according to claim 6 including the step of controlling at least one of the output lightwaves with a controllable frequency matched lightwave modulator.

8. The method of generating a multi-color light beam according to claim 6 including the steps of individually controlling the output lightwaves with a plurality of individually controllable frequency matched lightwave modulators.

9. A method of generating a three-color light beam comprising the steps of producing a lightwave having a wavelength substantially equal to 870 nm and introducing it into a waveguide to generate additional lightwaves having wavelengths substantially equal to 1060 nm and 1300 nm, frequency doubling the three lightwaves to produce output lightwaves having wavelengths substantially equal to 435 nm, 530 nm and 650 nm, respectively, and individually controlling the output lightwaves with a plurality of individually controllable frequency matched lightwave modulators, and removing lightwaves having wavelengths other than the output lightwaves, whereby a co-propagated modulated coherent three-color output light beam is produced.

* * * * *